(12) United States Patent
Jo et al.

(10) Patent No.: US 11,450,718 B2
(45) Date of Patent: Sep. 20, 2022

(54) DISPLAY APPARATUS AND METHOD OF MANUFACTURING THE SAME

(71) Applicant: Samsung Display Co., Ltd., Yongin-si (KR)

(72) Inventors: Hanggochnuri Jo, Yongin-si (KR); Woosik Jeon, Yongin-si (KR); Eonseok Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 109 days.

(21) Appl. No.: 16/827,181

(22) Filed: Mar. 23, 2020

(65) Prior Publication Data

US 2020/0365667 A1    Nov. 19, 2020

(30) Foreign Application Priority Data

May 13, 2019  (KR) .......................... 10-2019-0055835

(51) Int. Cl.
  *H01L 27/32*  (2006.01)
  *H01L 51/00*  (2006.01)
  *H01L 51/56*  (2006.01)

(52) U.S. Cl.
  CPC ...... *H01L 27/3234* (2013.01); *H01L 27/3246* (2013.01); *H01L 27/3262* (2013.01); *H01L 27/3272* (2013.01); *H01L 51/0016* (2013.01); *H01L 51/56* (2013.01); *H01L 2227/323* (2013.01)

(58) Field of Classification Search
  None
  See application file for complete search history.

(56) References Cited

U.S. PATENT DOCUMENTS

| | | | |
|---|---|---|---|
| 6,369,495 B2 | 4/2002 | Codama et al. | |
| 9,818,814 B2 | 11/2017 | Park et al. | |
| 2017/0012087 A1* | 1/2017 | Seo | ...... H01L 51/5221 |
| 2018/0089485 A1* | 3/2018 | Bok | ...... G06K 9/0002 |
| 2018/0108795 A1 | 4/2018 | Jeong et al. | |
| 2019/0196635 A1 | 6/2019 | Park et al. | |

FOREIGN PATENT DOCUMENTS

| | | |
|---|---|---|
| JP | 2007-234318 A | 9/2007 |
| KR | 10-1483193 B1 | 1/2015 |
| KR | 10-2016-0130018 A | 11/2016 |
| KR | 10-2018-0043113 A | 4/2018 |
| KR | 10-2018-0050473 A | 5/2018 |

OTHER PUBLICATIONS

Gecys, Paulius et al.; "Ultrashort pulsed laser induced material lift-off processing of CZTSe thin-film solar cells"; ScienceDirect; Solar Energy 102; 2014; pp. 82-90.

* cited by examiner

*Primary Examiner* — Michelle Mandala
(74) *Attorney, Agent, or Firm* — Lewis Roca Rothgerber Christie LLP

(57) ABSTRACT

A display apparatus may include a substrate including a display area and a sensor area, the display area including a main pixel, and the sensor area including an auxiliary pixel and a transmission area, a first pixel electrode and a light-emitting layer each in the main pixel, a second pixel electrode and a second light-emitting layer each in the auxiliary pixel, an opposite electrode integrally arranged in the display area and the sensor area, and defining an opening corresponding to the transmission area, and an organic pattern layer surrounding at least a part of the transmission area.

14 Claims, 10 Drawing Sheets

DISPLAY APPARATUS AND METHOD OF MANUFACTURING THE SAME

CROSS-REFERENCE TO RELATED APPLICATION

This application claims priority to, and the benefit of, Korean Patent Application No. 10-2019-0055835, filed on May 13, 2019, in the Korean Intellectual Property Office, the disclosure of which is incorporated herein in its entirety by reference.

BACKGROUND

1. Field

One or more embodiments of the present disclosure relate to a display apparatus, and to a method of manufacturing the same.

2. Description of the Related Art

Recently, the purposes of display apparatuses have diversified. In addition, as display apparatuses have become thinner and lighter, the display apparatuses are increasingly widely used.

As display apparatuses are variously utilized, various methods for designing various forms of the display apparatuses may be used, and functions that may be combined or linked with the display apparatuses are increasing.

SUMMARY

One or more embodiments of the present disclosure include a display apparatus including a light transmission area in a display area. However, the one or more embodiments are only examples, and the scope of the present disclosure is not limited thereto.

Additional aspects will be set forth in part in the description that follows and, in part, will be apparent from the description, or may be learned by practice of the presented embodiments.

According to one or more embodiments, a display apparatus includes a substrate including a display area and a sensor area, the display area including a main pixel, and the sensor area including an auxiliary pixel and a transmission area, a first pixel electrode and a light-emitting layer each in the main pixel, a second pixel electrode and a second light-emitting layer each in the auxiliary pixel, an opposite electrode integrally arranged in the display area and the sensor area, and defining an opening corresponding to the transmission area, and an organic pattern layer surrounding at least a part of the transmission area.

The display apparatus may further include an inorganic insulating layer on the substrate, and defining a first hole corresponding to the transmission area, wherein the opposite electrode is on a side wall of the first hole.

The organic pattern layer may be in the first hole.

The opening of the opposite electrode may be smaller than the first hole.

The display apparatus may further include a functional layer integrally arranged in the display area and the sensor area between the first pixel electrode and the opposite electrode, and defining an opening corresponding to the transmission area, wherein the opening of the opposite electrode overlaps the opening of the functional layer to thereby form a transmission hole.

The display apparatus may further include a pixel-defining layer covering edges of the first pixel electrode and the second pixel electrode, configured to define a light-emitting area, and including a same material as the organic pattern layer.

A side of the organic pattern layer may be thicker than the other side of the organic pattern layer.

The opposite electrode may be on the organic pattern layer, and a side thereof may be thicker than the other side thereof.

The display apparatus may further include a lower electrode layer in the sensor area, between the substrate and an auxiliary thin-film transistor of the auxiliary pixel.

The display apparatus may further include a component on a lower surface of the substrate and corresponding to the sensor area.

According to one or more embodiments, a display apparatus includes a substrate on which a pixel including a display element and a transmission area are arranged, a pixel electrode and a light-emitting layer in the pixel, an opposite electrode on the light-emitting layer, and defining an opening corresponding to the transmission area, and an organic pattern layer at a periphery of the transmission area, wherein the opposite electrode is on the organic pattern layer and has an uneven thickness.

The display apparatus may further include an inorganic insulating layer on the substrate, and defining a first hole corresponding to the transmission area, wherein the opposite electrode is on a side wall of the first hole.

The organic pattern layer may be in the first hole.

An opening of the opposite electrode may be smaller than the first hole.

According to one or more embodiments, a method of manufacturing a display apparatus including a substrate having a display area including a main pixel, and having a sensor area including an auxiliary pixel and a transmission area, the method including forming a sacrificial metal layer on an upper surface of the substrate and overlapping the transmission area, forming a preliminary organic pattern layer covering the sacrificial metal layer and corresponding to the transmission area, forming an opposite electrode on the preliminary organic pattern layer, emitting a laser beam from a lower surface of the substrate toward the sacrificial metal layer, and lifting the sacrificial metal layer off of the substrate.

The preliminary organic pattern layer may have a hemispherical shape.

The method may further include using a halftone mask to form the preliminary organic pattern layer.

The method may further include forming a pixel-defining layer covering an edge of a pixel electrode of the main pixel using a same process for forming the preliminary organic pattern layer.

The method may further include removing a part of the preliminary organic pattern layer such that an organic pattern layer is arranged in a periphery of the transmission area.

The laser beam may include infrared light.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
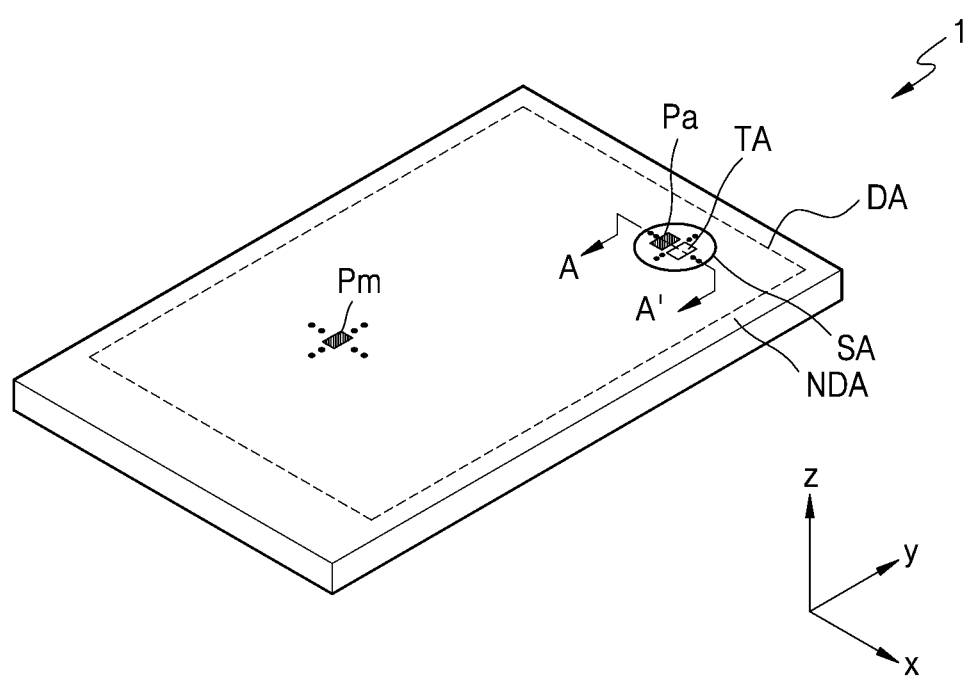
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

Hereinafter, embodiments will be described in detail with reference to the attached drawings. Like reference numerals in the drawings denote like elements, and thus their descriptions will not be repeated.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" or "coupled to" another layer, region, or component, it may be "directly connected or coupled" to the other layer, region, or component, or "indirectly connected to" the other layer, region, or component with intervening elements therebetween. For example, when a layer, region, or component is referred to as being electrically "connected to" or "coupled to" another layer, region, or component, it may be electrically "directly connected or coupled" to the other layer, region, or component, or electrically "indirectly connected to" the other layer, region, or component with intervening elements therebetween.

FIG. 1 is a schematic perspective view of a display apparatus 1 according to an embodiment.

Referring to FIG. 1, the display apparatus 1 includes a display area DA that renders an image, and a non-display area NDA that does not render an image. The display apparatus 1 may provide a main image by using light emitted from a plurality of main pixels Pm in the display area DA.

The display apparatus 1 includes a sensor area SA. The sensor area SA may be an area below which a component, such as a sensor using infrared light, visible light, sound, etc., is arranged. This will be described later with reference to FIG. 2. The sensor area SA may include a transmission area TA into which light and/or sound is transmitted, wherein the light and/or sound are output from a component to outside, or wherein the light and/or sound proceed from outside to the component. As an example, when infrared light is transmitted into the sensor area SA, infrared light transmittance into an entire area of the sensor area SA may be about 15% or greater, 20% or greater, 25% or greater, 50% or greater, 85% or greater, or 90% or greater.

In the present embodiment, a plurality of auxiliary pixels Pa may be arranged in the sensor area SA. The sensor area SA may provide a certain image by using light emitted from the plurality of auxiliary pixels Pa. The image provided in the sensor area SA is an auxiliary image, and thus, may have a resolution that is lower than that of an image provided in the display area DA. That is, because the sensor area SA includes the transmission area TA into which, or through which, light and/or sound is transmitted, the number of auxiliary pixels Pa that may be arranged in a unit area of the sensor area SA may be less than the number of main pixels Pm arranged in a unit area of the display area DA.

The sensor area SA may be at least partially surrounded by the display area DA. As an example, FIG. 1 shows that the whole sensor area SA is surrounded by the display area DA.

Hereinafter, an organic light-emitting display apparatus is explained as an example of the display apparatus 1 according to an embodiment. However, the display apparatus 1 in the present disclosure is not limited thereto. As another embodiment, the display apparatus 1 in the present disclosure may be one or more of various types of display apparatus, such as an inorganic electroluminescent (EL)

display (inorganic light-emitting display) apparatus, a quantum dot light-emitting display apparatus, etc.

FIG. 1 shows that the sensor area SA is arranged at a side (an upper right side) of the display area DA having a rectangular shape. However, the present disclosure is not limited thereto. The display area DA may have a shape of a circle, an oval, or a polygon such as a triangle, a pentagon, etc. A position of the sensor area SA and the number of sensor areas SA may also be variously modified in other embodiments.

Figure 2:
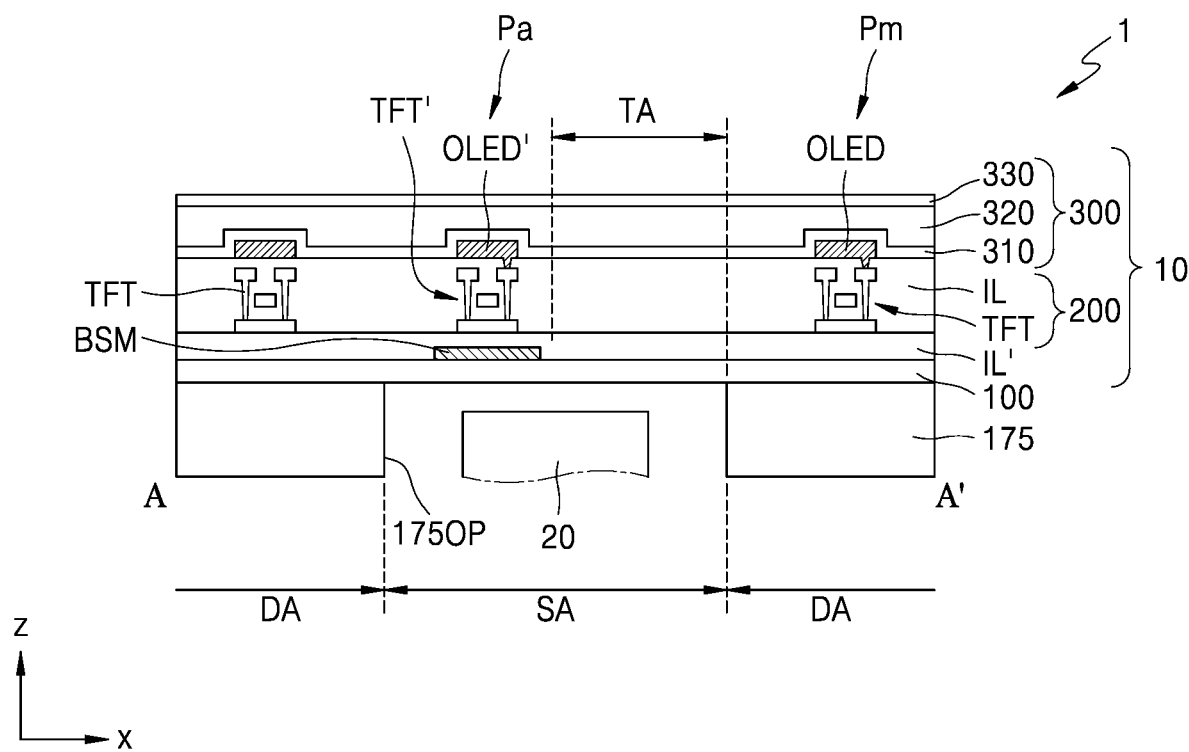
FIG. 2 is a schematic cross-sectional view of a display apparatus according to embodiments.

FIG. 2 is a schematic cross-sectional view of the display apparatus 1 according to embodiments, in correspondence with the line A-A' of FIG. 1.

Referring to FIG. 2, the display apparatus 1 may include a display panel 10 including a display element, and a component 20 corresponding to the sensor area SA.

The display panel 10 may include a substrate 100, a display element layer 200 arranged on the substrate 100, and a thin-film encapsulation layer 300 as an encapsulation member sealing the display element layer 200. In addition, the display panel 10 may further include a lower protective film 175 below the substrate 100.

The substrate 100 may include glass or a polymer resin. When the substrate 100 includes a polymer resin, the substrate 100 may be flexible, rollable, or bendable. The substrate 100 may have a multi-layered structure that includes a layer including a polymer resin, and an inorganic layer.

The display element layer 200 may include a circuit layer including a main thin-film transistor TFT and an auxiliary thin-film transistor TFT', a main organic light-emitting diode OLED and an auxiliary organic light-emitting diode OLED' as a display element, and insulating layers IL and IL' therebetween.

In the display area DA, a main pixel Pm may be arranged, wherein the main pixel Pm includes the main thin-film transistor TFT and the main organic light-emitting diode OLED connected thereto. In the sensor area SA, an auxiliary pixel Pa may be arranged, wherein the auxiliary pixel Pa includes the auxiliary thin-film transistor TFT' and the auxiliary organic light-emitting diode OLED' connected thereto.

In addition, in the sensor area SA, the transmission area TA may be arranged, wherein the auxiliary thin-film transistor TFT' and a display element are not arranged in the transmission area TA. The transmission area TA may be understood as an area into which/through which light and/or sound is transmitted, wherein the light and/or sound are output from the component 20 to the outside, or proceed from the outside to the component 20.

The component 20 may be arranged in the sensor area SA. The component 20 may be an electronic element using light or sound. For example, the component 20 may be a sensor for receiving and using light (e.g., an infrared light sensor), for measuring a distance, for recognizing a fingerprint, etc. by outputting and detecting light or sound, may be a small lamp for outputting light, or may be a speaker for outputting sound, etc. In a case of the electronic element using light, light in various wavelength bands, such as visible light, infrared light, ultraviolet light, etc., may be used. A plurality of components 20 may be arranged in the sensor area SA. For example, a light-emitting device and a light-receiving device may be included together as the component 20 in a sensor area SA. Alternatively, a light-emitting device and a light-receiving device may be included in a component 20.

An electrode layer BSM may be arranged in the sensor area SA. The electrode layer BSM may be arranged to correspond to an auxiliary pixel Pa. That is, the electrode layer BSM may be arranged to correspond to a lower portion of the auxiliary thin-film transistor TFT'. The electrode layer BSM may prevent or reduce external light reaching the auxiliary pixel Pa including the auxiliary thin-film transistor TFT', etc. For example, light emitted from the component 20 may be prevented from reaching the auxiliary pixel Pa. A constant voltage or signal is applied to the electrode layer BSM to thereby prevent a pixel circuit from being damaged by electrostatic discharge.

The thin-film encapsulation layer 300 may include at least one inorganic encapsulation layer and at least one organic encapsulation layer. In relation to this, FIG. 2 shows first and second inorganic encapsulation layers 310 and 330, and an organic encapsulation layer 320 therebetween.

The organic encapsulation layer 320 may include a polymer-based material. For example, the organic encapsulation layer 320 may include polyethylene terephthalate, polyethylene naphthalate, polycarbonate, polyimide, polyethylene sulfonate, polyoxymethylene, polyarylate, hexamethyldisiloxane, acrylic-based resin (e.g., polymethyl methacrylate, polyacrylic acid, etc.), or some combination thereof.

The first and second inorganic encapsulation layers 310 and 330 may include one or more inorganic insulating materials selected from aluminum oxide, titanium oxide, tantalum oxide, hafnium oxide, zinc peroxide, silicon oxide, silicon nitride, and silicon oxynitride. The second inorganic encapsulation layer 330 may cover the organic encapsulation layer 320, and may include silicon oxide, silicon nitride, and/or silicon oxynitride. The second inorganic encapsulation layer 330 may be deposited to be in direct contact with the first inorganic encapsulation layer 310 in an edge area of the display apparatus 1. Thus, the organic encapsulation layer 320 may not be exposed to outside.

The lower protective film 175 is attached to a lower portion of the substrate 100 to thereby support and protect the substrate 100. The lower protective film 175 may include/define an opening 175OP corresponding to the sensor area OA. As the opening 175OP is included in the lower protective film 175, light transmittance in the sensor area SA may be enhanced. The lower protective film 175 may include polyethylene terephthalate (PET) or polyimide (PI). When the substrate 100 includes glass, the lower protective film 175 may be omitted.

The sensor area SA may have a size that is greater than a size of an area in which the component 20 is arranged. Accordingly, a size of the opening 175OP in the lower protective film 175 may not match a size of the sensor area SA. For example, the opening 175OP may have a size that is smaller than a size of the sensor area SA.

In other embodiments, a component, such as an input detection member that is configured to detect a touch input, a reflection prevention member including a polarizer, a retarder, a color filter, or a black matrix, or a transparent window, may be further arranged on the display panel 10.

In the present embodiment, it is shown that the thin-film encapsulation layer 300 is used as an encapsulation member that is configured to seal the display element layer 200. However, the present disclosure is not limited thereto. For example, as a member for sealing the display element layer 200, an encapsulation substrate that is bonded to the substrate 100 by using a sealant or a frit may be used.

Figure 3:
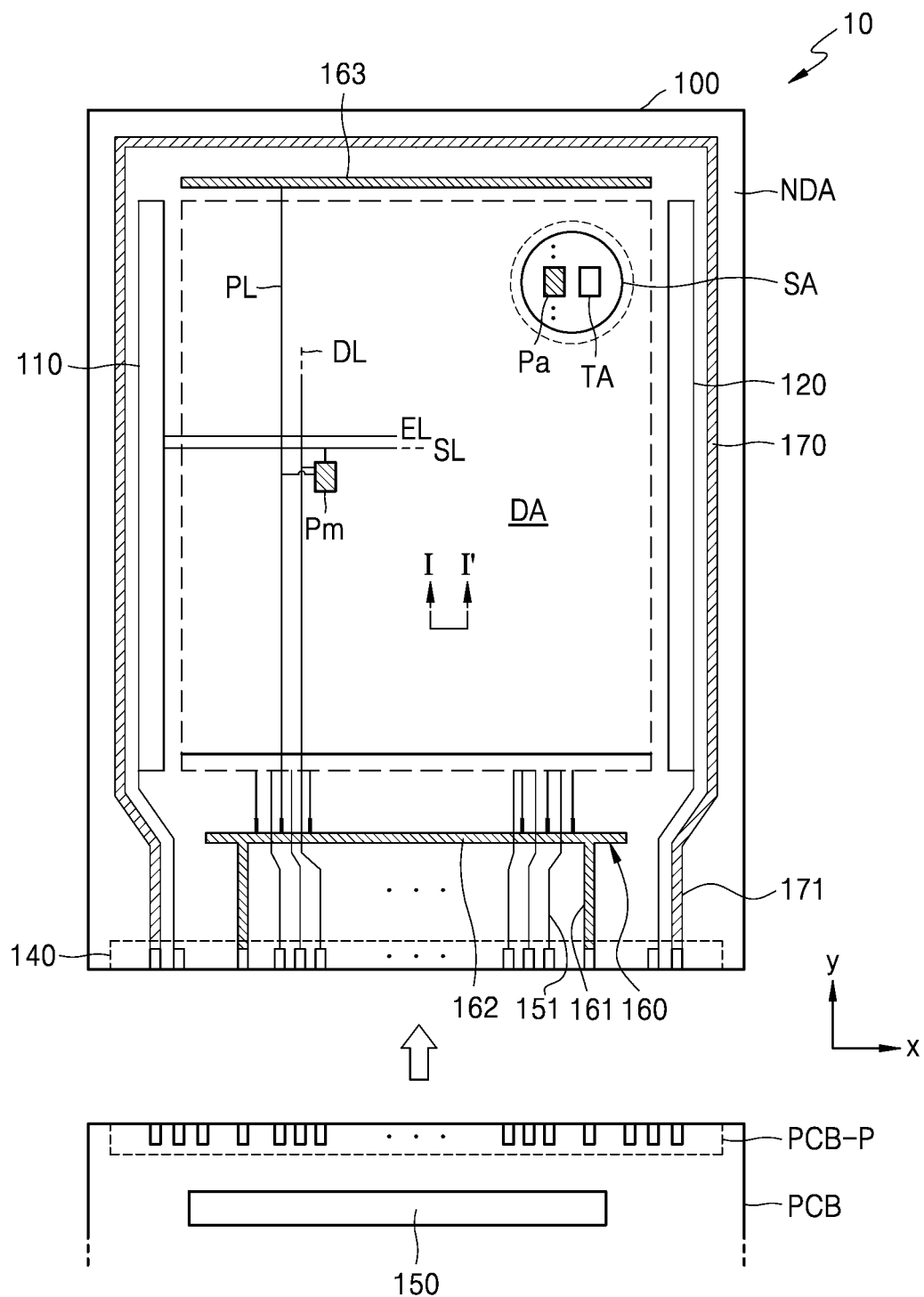
FIG. 3 is a schematic plan view of a display apparatus according to an embodiment.

FIG. 3 is a schematic plan view of the display panel 10 according to an embodiment.

Referring to FIG. 3, the display panel 10 is arranged in the display area DA and includes the plurality of main pixels Pm. The main pixels Pm may each include a display element, such as an organic light-emitting diode. Each of the main pixels Pm may emit, for example, red, green, blue, or white light via the organic light-emitting diode. In this specification, as described above, a main pixel Pm may be understood as a pixel for emitting light of a color among red, green, blue, and white. The display area DA is covered by the encapsulation member described above with reference to FIG. 2 to be thereby protected from external air, moisture, or the like.

The sensor area SA may be arranged inside the display area DA, and the plurality of auxiliary pixels Pa are arranged in the sensor area SA. The auxiliary pixels Pa may each include a display element, such as an organic light-emitting diode. Each of the auxiliary pixels Pa may emit, for example, red, green, blue, or white light via the organic light-emitting diode. In this specification, as described above, an auxiliary pixel Pa may be a sub-pixel for emitting light of a color among red, green, blue, and white. In the sensor area SA, the transmission area TA arranged between the auxiliary pixels Pa may be provided.

In an embodiment, a pixel circuit of a main pixel Pm may be the same as that of an auxiliary pixel Pa. However, the present disclosure is not limited thereto. A pixel circuit included in the main pixels Pm may be different from a pixel circuit included in the auxiliary pixels Pa.

Because the sensor area SA includes the transmission area TA, a resolution of the sensor area SA may be less than a resolution of the display area DA. For example, a resolution of the sensor area SA may be about a half of a resolution of the display area DA. In some embodiments, a resolution of the display area DA may be about 400 pixels per inch (ppi) or higher, and a resolution of the sensor area SA may be about 200 ppi.

Each of the main pixels Pm and the auxiliary pixels Pa may be electrically connected to peripheral circuits in the non-display area NDA. In the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide a scan signal to each of the main pixels Pm and the auxiliary pixels Pa via a scan line SL. The first scan driving circuit 110 may provide a light-emission control signal to each of the main pixels Pm and the auxiliary pixels Pa via a light-emission control line EL. The second scan driving circuit 120 may be arranged in parallel with the first scan driving circuit 110 with the display area DA therebetween. Some of the main pixels Pm and the auxiliary pixels Pa in the display area DA may be electrically connected to the first scan driving circuit 110, while other ones of the main pixels Pm and the auxiliary pixels Pa in the display area DA may be connected to the second scan driving circuit 120. In another embodiment, the second scan driving circuit 120 may be omitted.

A terminal 140 may be arranged at a side of the substrate 100. The terminal 140 might not be covered by an insulating layer, but may instead be exposed to be electrically connected to a printed circuit board PCB. A terminal PCB-P of the printed circuit board PCB may be electrically connected to the terminal 140 of the display panel 10. The printed circuit board PCB may deliver a signal or power of a controller to the display panel 10. A control signal generated from the controller may be transmitted to the first and second scan driving circuits 110 and 120 via the printed circuit board PCB. The controller may provide first and second power voltages ELVDD and ELVSS respectively to the first and second power supply lines 160 and 170 via first and second connection lines 161 and 171. The first power voltage ELVDD may be supplied to each of the main pixels Pm and the auxiliary pixels Pa via a driving voltage line PL connected to the first power supply line 160. The second power voltage ELVSS may be supplied to an opposite electrode of each of the main pixels Pm and the auxiliary pixels Pa connected to the second power supply line 170.

The data driving circuit 150 is electrically connected to the data line DL. A data signal of the data driving circuit 150 may be provided to each of the main pixels Pm and the auxiliary pixels Pa via a connection line 151 connected to the terminal 140 and via the data line DL connected to the connection line 151. FIG. 3 shows that the data driving circuit 150 is arranged on the printed circuit board PCB. However, as another embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 extending in parallel with each other in an x-direction with the display area DA therebetween. The second power supply line 170 may have a loop shape with an open side, and may partially surround the display area DA.

Figure 4:
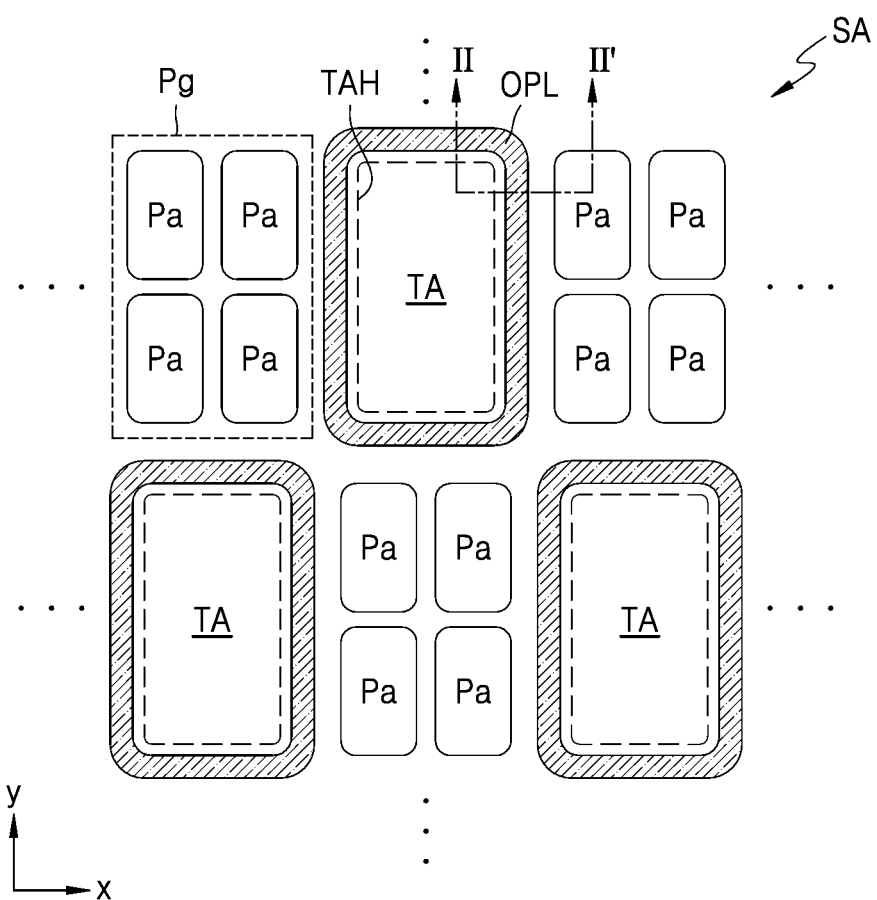
FIG. 4 is a schematic plan view of a portion of a sensor area of FIG. 3.
Figure 5:
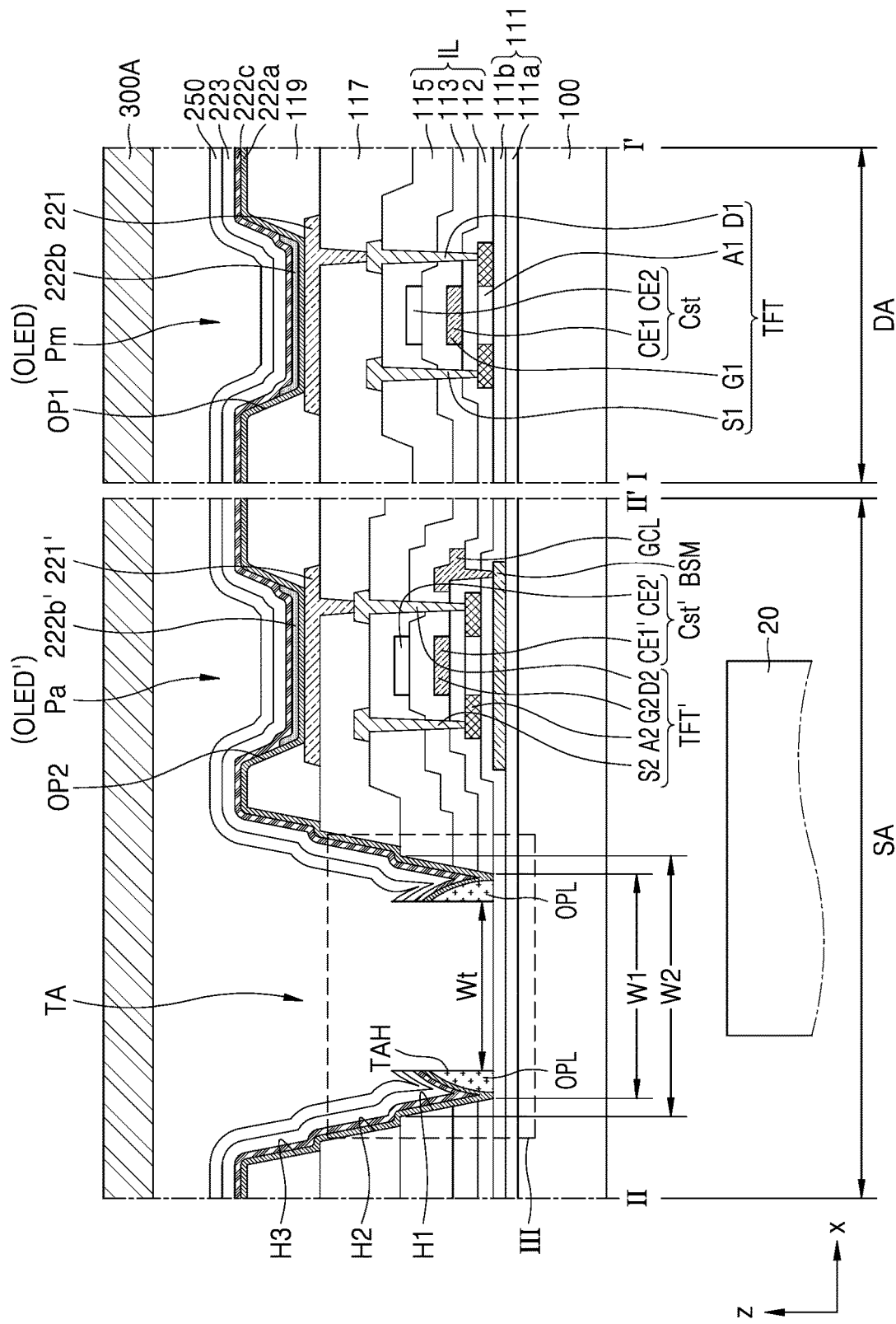
FIG. 5 is a schematic perspective view according to the display apparatus taken along the line I-I' of FIG. 3 and the portion of the sensor area taken along the line II-II' of FIG. 4 according to an embodiment.
Figure 6:
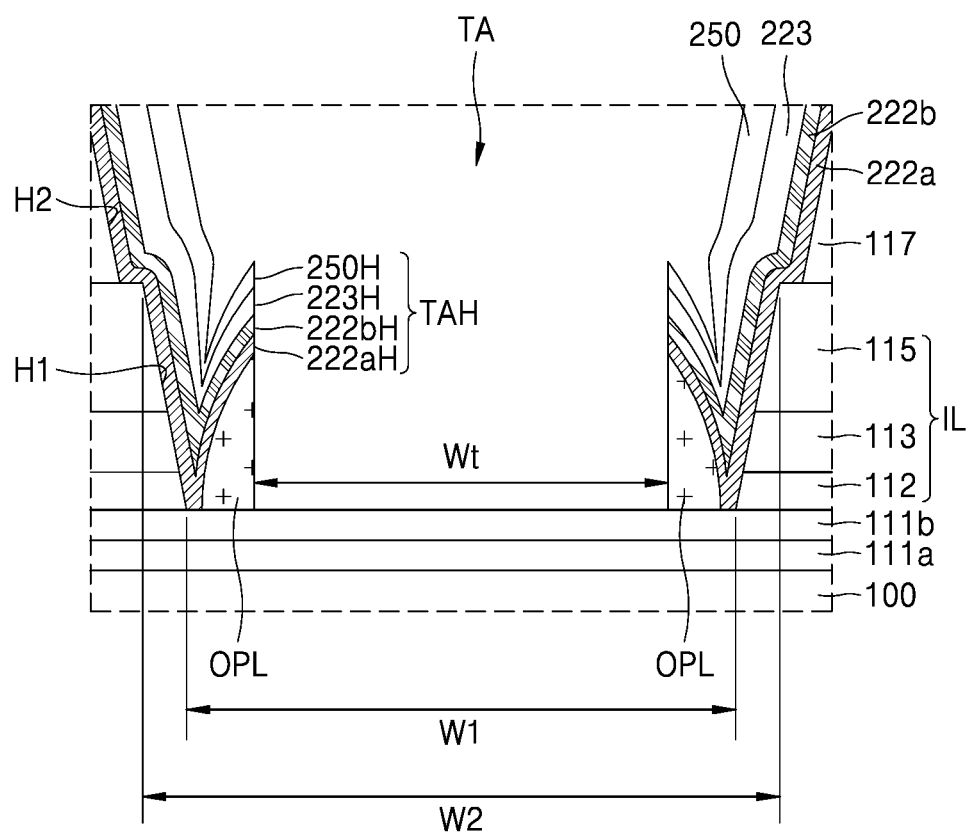
FIG. 6 is a magnified cross-sectional view of a portion III of FIG. 5.

FIG. 4 is a schematic plan view illustrating a part of the sensor area SA of FIG. 3. FIG. 5 is a schematic cross-sectional view of the part of the sensor area SA taken along the line I-I' of FIG. 3 and the line II-II' of FIG. 4. FIG. 6 is a magnified view of the region III of FIG. 5.

Referring to FIG. 4, in the sensor area SA of the display apparatus according to an embodiment, the auxiliary pixels Pa and transmission areas TA are arranged. Auxiliary pixels (e.g., predetermined auxiliary pixels) Pa are sequentially arranged to thereby constitute a pixel group Pg. At least one auxiliary pixel Pa may be included in the pixel group Pg. FIG. 4 shows that the pixel group Pg includes four auxiliary pixels Pa arranged in two columns and two rows (e.g., a 2 by 2 group). However, the present disclosure is not limited thereto. The number and arrangement of the auxiliary pixels Pa included in the pixel group Pg may be variously modified. For example, the pixel group Pg may include three auxiliary pixels Pa arranged in parallel with each other in a column.

The transmission area TA is an area in which a display element is not arranged, and thus, light transmittance is high. A plurality of transmission areas TA may be included in the sensor area SA. The transmission areas TA may be alternately arranged with the pixel group Pg in a first direction (e.g., the x-direction) and/or a second direction (e.g., a y-direction). Alternatively, the transmission areas TA may be arranged to surround the pixel group Pg. Alternately, the auxiliary pixels Pa may be arranged to surround the transmission areas TA.

In the present embodiment, in a periphery of the transmission areas TA, an organic pattern layer OPL is arranged to surround at least a part of the transmission areas TA. It may be understood that the organic pattern layer OPL is arranged between the transmission area TA and the pixel groups Pg. FIG. 4 shows that the organic pattern layer OPL is sequentially arranged to surround a transmission area TA. However, the organic pattern layer OPL is not limited thereto. A part of the organic pattern layer OPL may be cut. As such, the organic pattern layer OPL may be variously modified.

Referring to FIG. 5, the display apparatus according to an embodiment includes the display area DA and the sensor area SA. The main pixel Pm is arranged in the display area DA. The auxiliary pixel Pa and the transmission area TA are arranged in the sensor area SA.

The main pixel Pm may include a main thin-film transistor TFT, a main storage capacitor Cst, and a main organic light-emitting diode OLED. The auxiliary pixel Pa may include an auxiliary thin-film transistor TFT', an auxiliary storage capacitor Cst', and an auxiliary organic light-emitting diode OLED'. The transmission area TA may include a transmission hole TAH to correspond to the transmission area TA. The organic pattern layer OPL is arranged at a periphery of the transmission hole TAH.

The component 20 may be arranged below the sensor area SA. The component 20 may be an infrared (IR) sensor configured to transmit/receive infrared light. Because the transmission area TA is arranged in the sensor area SA, an infrared light signal transmitted to/received from the component 20 may be transmitted into the sensor area SA. For example, light emitted from the component 20 may proceed through the transmission area TA in a z-direction. Light generated from outside of the display apparatus and incident on the component 20 may proceed through the transmission area TA in a -z-direction.

Hereafter, a structure of components stacked in the display apparatus according to the present embodiment is described.

The substrate 100 may include glass or a polymer resin. The polymer resin may include polyethersulphone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), cellulose acetate propionate (CAP), or the like The substrate 100 including a polymer resin may be flexible, rollable, or bendable. In some embodiments, the substrate 100 may have a multi-layered structure that includes a layer including the polymer resin described above, and an inorganic layer.

A buffer layer 111 may be located on the substrate 100, and may reduce or obstruct penetration of a foreign substance, moisture, or external air from below the substrate 100. The buffer layer 111 may provide a planarization surface to the substrate 100. The buffer layer 111 may include an inorganic material, such as oxide or nitride, an organic material, or an organic and inorganic compound. The buffer layer 111 may include a single layer, or may include multiple layers including an inorganic material and an organic material. In other embodiments, a barrier layer for obstructing penetration of external air may be further included between the substrate 100 and the buffer layer 111. In some embodiments, the buffer layer 111 may include silicon nitride ($SiN_x$) and/or silicon oxide ($SiO_2$). The buffer layer 111 may be provided so that a first buffer layer 111a and a second buffer layer 111b are stacked in the buffer layer 111.

In the sensor area SA, a lower electrode layer BSM may be arranged between the first buffer layer 111a and the second buffer layer 111b. As another embodiment, the lower electrode layer BSM may be arranged between the substrate 100 and the first buffer layer 111a. The lower electrode layer BSM is arranged below the auxiliary thin-film transistor TFT' to thereby prevent characteristics of the auxiliary thin-film transistor TFT' from being worsened by light emitted from the component 20, etc.

In addition, the lower electrode layer BSM may be connected to a line GCL that is arranged on a different layer than the lower electrode layer BSM via a contact hole. The lower electrode BSM may provide a constant voltage from the line GCL. For example, the lower electrode layer BSM may receive a driving voltage ELVDD or a scan signal. As the lower electrode layer BSM receives a constant voltage or a signal, a probability of electrostatic discharge may be greatly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may include a single layer or multiple layers including the above-described material.

The main thin-film transistor TFT and the auxiliary thin-film transistor TFT' may be arranged on the buffer layer 111. The main thin-film transistor TFT may include a first semiconductor layer A1, a first gate electrode G1, a first source electrode S1, and a first drain electrode D1. The auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED in the display area DA to thereby drive the main organic light-emitting diode OLED. The auxiliary thin-film transistor TFT' may be connected to the auxiliary organic light-emitting diode OLED' in the sensor area SA to thereby drive the auxiliary organic light-emitting diode OLED'.

The first semiconductor layer A1 and the second semiconductor layer A2 may be arranged on the buffer layer 111 and may include polysilicon. As another embodiment, the first semiconductor layer A1 and the second semiconductor layer A2 may include amorphous silicon. As another embodiment, the first semiconductor layer A1 and the second semiconductor layer A2 may include at least one material of oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel area, and may include a source area and a drain area each doped with an impurity.

The second semiconductor layer A2 may overlap the lower electrode layer BSM with the second buffer layer 111b therebetween. As an example, the second semiconductor layer A2 may be provided to have a width that is narrower than a width of the lower electrode layer BSM. Accordingly, when the second semiconductor layer A2 is seen in a direction perpendicular to the substrate 100, an entirety of the second semiconductor layer A2 may overlap with the lower electrode layer BSM.

A first gate insulating layer 112 may be provided to cover the first semiconductor layer A1 and the second semiconductor layer A2. The first gate insulating layer 112 may include an inorganic insulating material such as $SiO_2$, $SiN_x$, silicon oxynitride (SiON), aluminum oxide ($Al_2O_3$), titanium oxide ($TiO_2$), tantalum pentoxide ($Ta_2O_5$), hafnium oxide ($HfO_2$), zinc peroxide ($ZnO_2$), or the like. The first gate insulating layer 112 may include a single layer, or may include multiple layers including one or more of the above-described material.

On the first gate insulating layer 112, a first gate electrode G1 and a second electrode G2 are arranged to overlap the first semiconductor layer A1 and the second semiconductor layer A2, respectively. The first gate electrode G1 and the second gate electrode G2 may include Mo, Al, Cu, Ti, or the like, and may include a single layer or multiple layers. As an example, the first gate electrode G1 and the second gate electrode G2 may include a single Mo layer.

The second gate insulating layer 113 may be provided to cover the first gate electrode G1 and the second gate electrode G2. The second gate insulating layer 113 may include an inorganic insulating layer such as $SiO_2$, $SiN_x$, SiON, $Al_2O_3$, $TiO_2$, $Ta_2O_5$, $HfO_2$, $ZnO_2$, or the like. The second gate insulating layer 113 may include a single layer or multiple layers including the above-described inorganic insulating material.

On the second gate insulating layer 113, a first upper electrode CE2 of the main storage capacitor Cst and a second upper electrode CE2' of the auxiliary storage capacitor Cst' may be arranged.

In the display area DA, the first upper electrode CE2 may overlap the first gate electrode G1 below the first upper electrode CE2. The first gate electrode G1 and the first upper electrode CE2 overlap each other with the second gate insulating layer 113 therebetween, and constitute the main storage capacitor Cst. The first gate electrode G1 may be a first lower electrode CE1 of the main storage capacitor Cst.

In the sensor area SA, a second upper electrode CE2' may overlap the second gate electrode G2 below the second upper electrode CE2'. The second gate electrode G2 and the second upper electrode CE2' overlap each other with the second gate insulating layer 113 therebetween, and may constitute the auxiliary storage capacitor Cst'. The first gate electrode G1 may be a second lower electrode CE1' of the auxiliary storage capacitor Cst'.

The first upper electrode CE2 and the second upper electrode CE2' may include Al, Pt, Pd, Ag, Mg, Au, Ni, Nd, Ir, Cr, Li, Ca, Mo, Ti, W, and/or Cu, and may include a single layer or multiple layers including one or more of the above-described material.

An interlayer insulating layer 115 may be provided to cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, $ZnO_2$, or the like.

When the first gate insulating layer 112, the second gate insulating layer 113, and the interlayer insulating layer 115 are collectively referred to as an inorganic insulating layer IL, the inorganic insulating layer IL may define a first hole H1 corresponding to the transmission area TA. The first hole H1 may be provided to expose an upper surface of the buffer layer 111 or the substrate 100. The first hole H1 may be formed such that a first opening of the first gate insulating layer 112, a second opening of the second gate insulating layer 113, and a third opening of the interlayer insulating layer 115 are arranged to correspond to the transmission area TA and overlap each other. The first to third openings may be each formed by using separate processes, or may be formed at the same time by using a same process. Alternately, for example, the first and second openings may be formed at the same time, and the third opening may be separately formed. As such, forming of the first to third openings may be variously modified. When the first to third openings are formed by using separate processes, a height difference may be formed at a side of the first hole H1.

The inorganic insulating layer IL may include a groove instead of the first hole H1 exposing the buffer layer 111. For example, the first gate insulating layer 112 in the inorganic insulating layer IL may be sequentially arranged to correspond to the transmission area TA, and the second gate insulating layer 113 and the interlayer insulating layer 115 may respectively include the second opening and the third opening to correspond to the transmission area TA.

Alternatively, the first gate insulating layer 112 and the second gate insulating layer 113 may be sequentially arranged in correspondence with the transmission area TA, and the interlayer insulating layer 115 may include a third opening corresponding to the transmission area TA. As such, various modifications may be made.

As another embodiment, the inorganic insulating layer IL may omit the first hole H1 corresponding to the transmission area TA. Because the inorganic insulating layer IL may have transmittance of light that may be transmitted/received by the component 20, the inorganic insulating layer IL might not include a hole corresponding to the transmission area TA.

Source electrodes S1 and S2 and drain electrodes D1 and D2 are arranged on the interlayer insulating layer 115. The source electrodes S1 and S2 and the drain electrodes D1 and D2 may include a conductive material including Mo, Al, Cu, Ti, etc. and may include a single layer or multiple layers including the above-described material. As an example, the source electrodes S1 and S2 and the drain electrodes D1 and D2 may have a multi-layered structure including Ti/Al/Ti.

A planarization layer 117 may be arranged to cover the source electrodes S1 and S2 and the drain electrodes D1 and D2. The planarization layer 117 may include a planarized upper surface so that a first pixel electrode 221 and a second pixel electrode 221' are both evenly arranged on the planarization layer 117.

The planarization layer 117 may include a single layer or multiple layers including an organic material or an inorganic material. The planarization layer 117 may include benzocyclobutene (BCB), PI, hexamethyldisiloxane (HMDSO), a general-purpose polymer such as polymethyl methacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include $SiO_2$, $SiN_x$, SiON, $Al_2O_3$, $TiO_2$, $Ta_2O_5$, $HfO_2$, $ZnO_2$, or the like. After the planarization layer 117 is formed, chemical or mechanical polishing may be performed to provide a flat upper surface to the planarization layer 117.

The planarization layer 117 may include the second hole H2 in correspondence with the transmission area TA. The second hole H2 may be arranged to overlap the first hole H1. FIG. 5 shows that a lower width W2 of the second hole H2 is greater than a lower width W1 of the first hole H1. However, the present disclosure is not limited thereto. For example, the planarization layer 117 may be provided to cover an edge of the first hole H1 of the inorganic insulating layer IL, and thus, a width of the second hole H2 may be less than a width of the first hole H1.

In the planarization layer 117, an opening is present, wherein the opening exposes one of the first source electrode S1 and the first drain electrode D1 of the main thin-film transistor TFT. The first pixel electrode 221 may be in contact with the first source electrode S1 or the first drain electrode D1 via the opening to be thereby electrically connected to the main thin-film transistor TFT.

In addition, the planarization layer 117 includes an opening exposing one of the second source electrode S2 and the second drain electrode D2 of the auxiliary thin-film transistor TFT'. Thus, the second pixel electrode 221' may be in contact with the second source electrode S2 or the second drain electrode D2 via the opening to be thereby electrically connected to the auxiliary thin-film transistor TFT'.

The first pixel electrode 221 and the second pixel electrode 221' may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). As another embodiment, the first pixel electrode 221 and the second pixel electrode 221' may include a reflective layer such as Ag, Mg, Al, Pt, Pd, Au, Ni, Nd, Ir, Cr, or a compound thereof. As another embodiment, the first pixel electrode 221 and the second pixel electrode 221' may include a reflective layer including ITO, IZO, ZnO, or $In_2O_3$ on/below the reflective layer described above. In some embodiments, the first pixel electrode 221 and the second pixel electrode 221' may include a structure in which ITO/Ag/ITO are stacked.

A pixel-defining layer 119 may cover an edge of each of the first pixel electrode 221 and the second pixel electrode 221'. The pixel-defining layer 119 overlaps each of the first pixel electrode 221 and the second pixel electrode 221', and includes a first opening OP1 and a second opening OP2 each defining a light-emitting area of a pixel. The pixel-defining layer 119 may increase a distance between the edges of the first and second pixel electrodes 221 and 221' and an opposite electrode 223, which is on the first and second pixel electrodes 221 and 221', to thereby prevent an arc, etc. from occurring at the edges of the first and second pixel electrodes 221 and 221'. The pixel-defining layer 119 may include an organic insulating material such as PI, polyamide, acryl resin, BCB, HMDSO, phenol resin, or the like, and may be formed by using a spin coating method, etc.

The pixel-defining layer 119 may include a third hole H3 located in the transmission area TA. The third hole H3 may overlap the first hole H1 and the second hole H2. As the first hole H1, the second hole H2, and the third hole H3 are formed, light transmittance of the transmission area TA may be enhanced. The opposite electrode 223 that is to be described later may be arranged on inner walls of the first hole H1, the second hole H2, and the third hole H3.

An organic pattern layer OPL may be arranged inside the first hole H1, the second hole H2, and the third hole H3. The organic pattern layer OPL may be arranged spaced apart from the inner wall of the first hole H1. The organic pattern layer OPL may have a large thickness in a direction from the edge of the first hole H1 to a center of the first hole H1, That is, a side of the organic pattern layer OPL may be greater than another side of the organic pattern layer OPL.

The organic pattern layer OPL may include a configuration adopted to form the transmission hole TAH that is to be described later. A role of the organic pattern layer OPL will be described later.

The organic pattern layer OPL may include various organic materials. In some embodiments, the organic pattern layer OPL may be formed of a same material as that of the pixel-defining layer 119 at the same time as the pixel-defining layer 119. For example, the organic pattern layer OPL may include PI, polyamide, acryl resin, BCB, HMDSO, phenol resin, or the like.

In the present embodiment, a first functional layer 222a is arranged to cover the pixel-defining layer 119. The first functional layer 222a may include a single layer or multiple layers. The first functional layer 222a may include a single hole transport layer (HTL). Alternatively, the first functional layer 222a may include a hole injection layer (HIL) and an HTL. The first functional layer 222a may be formed integrally to correspond to the main pixels Pm and the auxiliary pixels Pa respectively included in the display area DA and the sensor area SA.

On the first functional layer 222a, a first light-emitting layer 222b and a second light-emitting layer 222b' are arranged in correspondence with the first pixel electrode 221 and the second pixel electrode 221', respectively. The first light-emitting layer 222b and the second light-emitting layer 222b' may include a polymer material or a low-molecular weight film. The first light-emitting layer 222b and the second light-emitting layer 222b' may emit red, green, blue, or white light.

A second functional layer 222c may be arranged on the first light-emitting layer 222b and the second light-emitting layer 222b'. The second functional layer 222c may include a single layer or multiple layers. The second functional layer 222c may include an ETL and/or an EIL. The second functional layer 222c may be arranged integrally in correspondence with the main pixels Pm and the auxiliary pixels Pa included in the display area DA and the sensor area SA. The first functional layer 222a and/or the second functional layer 222c may be omitted.

The opposite electrode 223 is arranged on the second functional layer 222c. The opposite electrode 223 may include a conductive material having a low work function. For example, the opposite electrode 223 may include a (semi)transparent layer including Ag, Mg, Al, Pt, Pd, Au, Ni, Nd, Ir, Cr, Li, Ca, an alloy thereof, or the like. Alternatively, the opposite electrode 223 may further include a layer including ITO, IZO, ZnO, or $In_2O_3$, on the (semi)transparent layer including the material described above. The opposite electrode 223 may be arranged integrally in correspondence with the main pixels Pm and the auxiliary pixels Pa included in the display area DA and the sensor area SA.

Layers ranging from the first pixel electrode 221 to the opposite electrode 223 in the display area DA may constitute the main organic light-emitting diode OLED. Layers ranging from the second pixel electrode 221' to the opposite electrode 223 in the sensor area SA may constitute the auxiliary organic light-emitting diode OLED'.

A capping layer 250 may be arranged on the opposite electrode 223. The capping layer 250 may include lithium-fluoride (LiF). Alternatively, the capping layer 250 may include an inorganic insulating material, such as silicon nitride, and/or an organic insulating material. In some embodiments, the capping layer 250 may be omitted.

In the present embodiment, the first functional layer 222a, the second functional layer 222c, the opposite electrode 223, and/or the capping layer 250 may be arranged on the organic pattern layer OPL. A thickness of each of the first functional layer 222a, the second functional layer 222c, the opposite electrode 223, and/or the capping layer 250 may not be constant. For example, on the organic pattern layer OPL, the opposite electrode 223 may have a small thickness when the opposite electrode 223 is near an inner wall of the first hole H1. That is, a side of the opposite electrode 223 may have a thickness that is smaller than a thickness of another side of the opposite electrode 223. Alternatively, it may be understood that a thickness of the opposite electrode 233 is uneven on the organic pattern layer OPL.

In the present embodiment, the first functional layer 222a, the second functional layer 222c, the opposite electrode 223, and the capping layer 250 may include the transmission hole TAH corresponding to the transmission area TA. That is, each of the first functional layer 222a, the second functional layer 222c, the opposite electrode 223, and the capping layer 250 may include openings 222aH, 222bH, 223H, and 250H corresponding to the transmission area TA, as shown in FIG. 6. In some embodiments, widths of the openings 222aH, 222bH, 223H, and 250H constituting the transmission hole TAH may be substantially identical to each other. For example, a width of the opening 223H of the opposite electrode 223 may be substantially identical to a width of the transmission hole TAH.

In addition, in the present embodiment, the first functional layer 222a, the second functional layer 222c, and the capping layer 250 may be omitted. In this case, the opening 223H of the opposite electrode 223 may be the transmission hole TAH.

The transmission hole TAH corresponding to the transmission area TA may be the transmission hole TAH overlapping the transmission area TA. In this case, the transmission hole TAH may have a smaller size than that of the first hole H1 in the inorganic insulating layer IL. To do so, FIG. 5 shows a width Wt of the transmission hole TAH that is less than a width W1 of the first hole H1. Here, a size of the transmission hole TAH and a size of the first hole H1 may be defined as a size of a narrowest opening among the openings 222aH, 222bH, 223H, and 250H.

In some embodiments, the first functional layer 222a, the second functional layer 222c, the opposite electrode 223, and the capping layer 250 may be arranged on side walls of the first hole H1, the second hole H2, and the third hole H3. In some embodiments, inclinations of side walls of the first hole H1, the second hole H2, and the third hole H3 against an upper surface of the substrate 100 may be smaller than an inclination of a side surface of the transmission hole TAH against an upper surface of the substrate 100.

Forming the transmission hole TAH indicates that a member, such as the opposite electrode 223, etc. is removed in correspondence with the transmission area TA. Thus, light transmittance in the transmission area TA may greatly increase.

The main organic light-emitting diode OLED and the auxiliary organic light-emitting diode OLED' may be covered by an encapsulation substrate 300A. The encapsulation substrate 300A includes a transparent material. For example, the encapsulation substrate 300A may include a glass material. Alternatively, the encapsulation substrate 300A may include a polymer resin, or the like. The encapsulation substrate 300A may reduce or prevent penetration of external moisture or foreign substances into the main organic light-emitting diode OLED and the auxiliary organic light-emitting diode OLED'.

A sealing material, such as a sealant, may be arranged between the substrate 100 and the encapsulation substrate 300A, wherein the main organic light-emitting diode OLED and the auxiliary organic light-emitting diode OLED' are arranged on the substrate 100. A sealing material may obstruct external moisture or foreign substance that may penetrate between the substrate 100 and the encapsulation substrate 300A.

Figure 7:
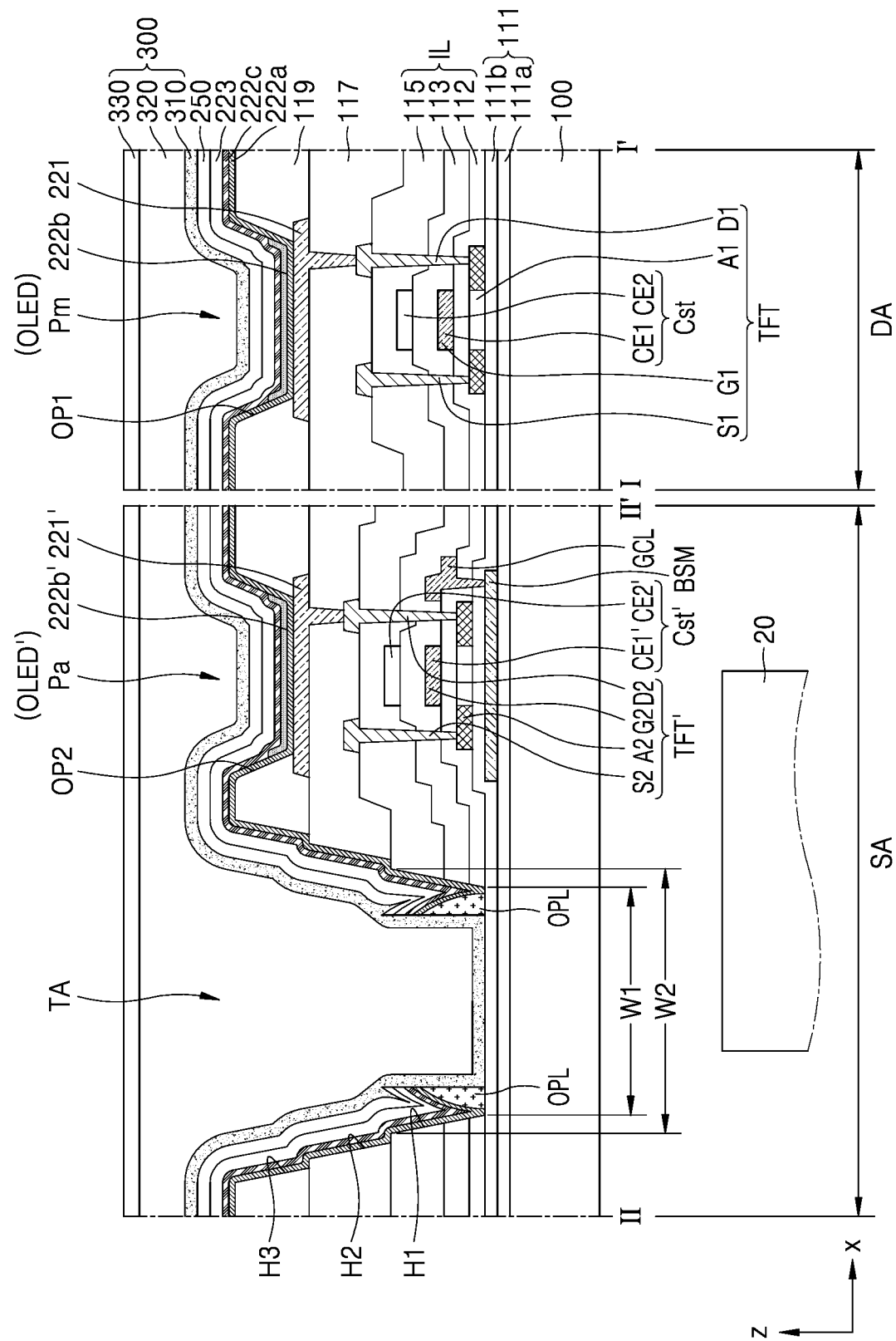
FIG. 7 is a schematic cross-sectional view of a display apparatus according to another embodiment.

FIG. 7 is a schematic cross-sectional view of a display apparatus according to another embodiment. In FIG. 7, like reference numerals in FIG. 5 denote like elements, and thus their description will be omitted.

Referring to FIG. 7, in the display apparatus according to the present embodiment, the thin-film encapsulation layer 300 is arranged on the capping layer 250. The thin-film encapsulation layer 300 may include at least one inorganic encapsulation layer and at least one organic encapsulation layer. In relation to this, FIG. 7 shows a structure in which the first inorganic encapsulation layer 310, an organic encapsulation layer 320, and a second inorganic encapsulation layer 330 are stacked in the thin-film encapsulation layer 300. In another embodiment, the number of organic encapsulation layers, the number of inorganic encapsulation layers, and a stacking order of the organic encapsulation layers and the inorganic encapsulation layers may be changed.

The first inorganic encapsulation layer 310 and the second inorganic encapsulation layer 330 may include at least one inorganic insulating material selected from aluminum oxide, titanium oxide, tantalum oxide, hafnium oxide, zinc peroxide, silicon oxide, silicon nitride, and silicon oxynitride. The first inorganic encapsulation layer 310 and the second inorganic encapsulation layer 330 may be formed by using a chemical vapor deposition (CVD) method, etc. The organic encapsulation layer 320 may include a polymer-based material. A polymer-based material may include a silicon-based resin, an acrylic-based resin, an epoxy-based resin, PI, polyethylene, or the like.

The first inorganic encapsulation layer 310, the organic encapsulation layer 320, and the second inorganic encapsulation layer 330 may be formed integrally to cover the display area DA and the sensor area SA. Accordingly, the first inorganic encapsulation layer 310 and the second inorganic encapsulation layer 330 may be arranged in the transmission hole TAH.

As another embodiment, the organic encapsulation layer 320 may be formed integrally to cover the display area DA and the sensor area SA, but may not be present in the transmission area TA. In other words, the organic encapsulation layer 320 may include an opening corresponding to the transmission area TA. In this case, the first inorganic encapsulation layer 310 may be in contact with the second inorganic encapsulation layer 330 in the transmission hole TAH.

Figure 8A:
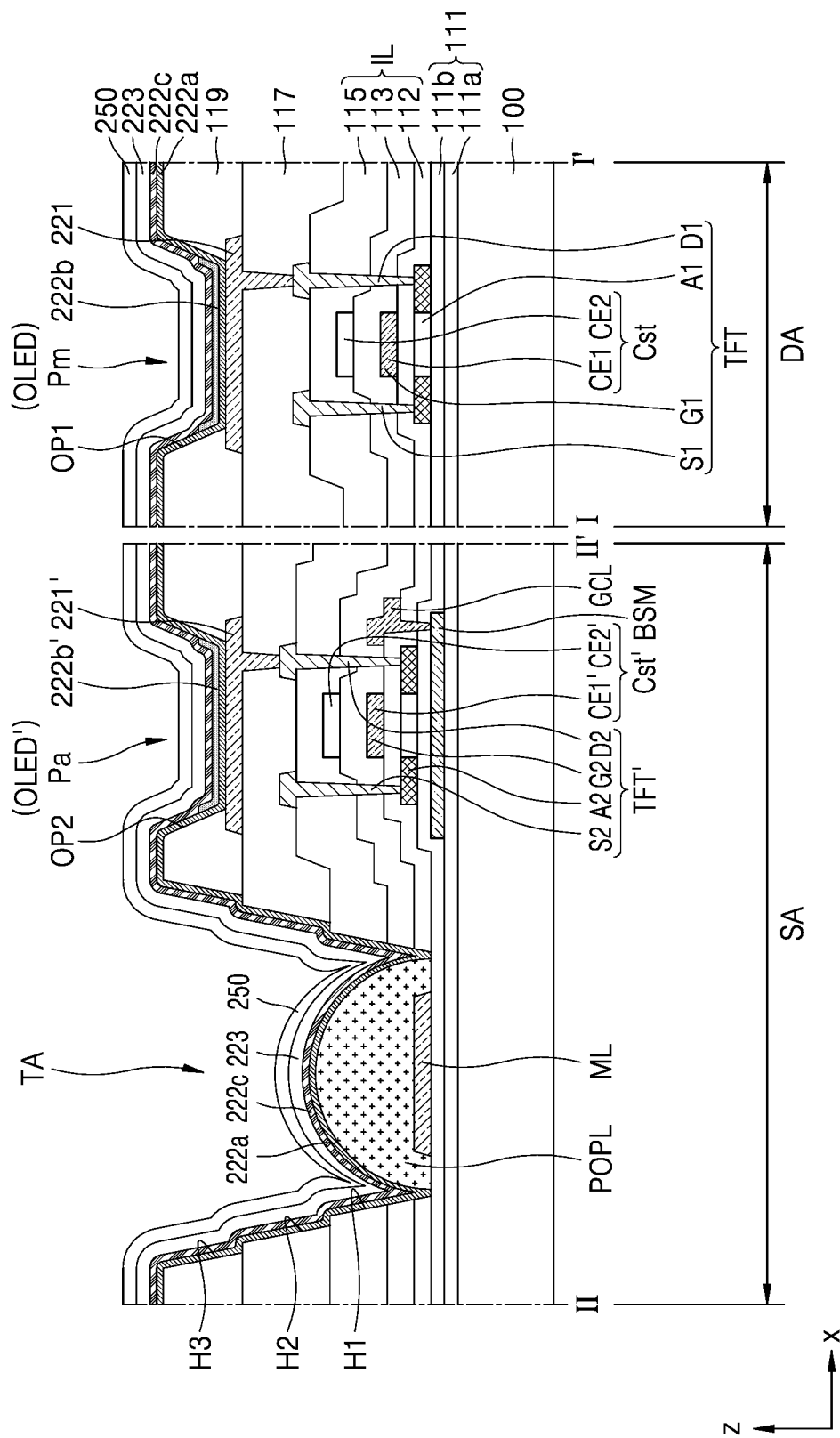
FIGS. 8A to 8C are cross-sectional views illustrating a method of manufacturing the display apparatus, according to embodiments.
Figure 8B:
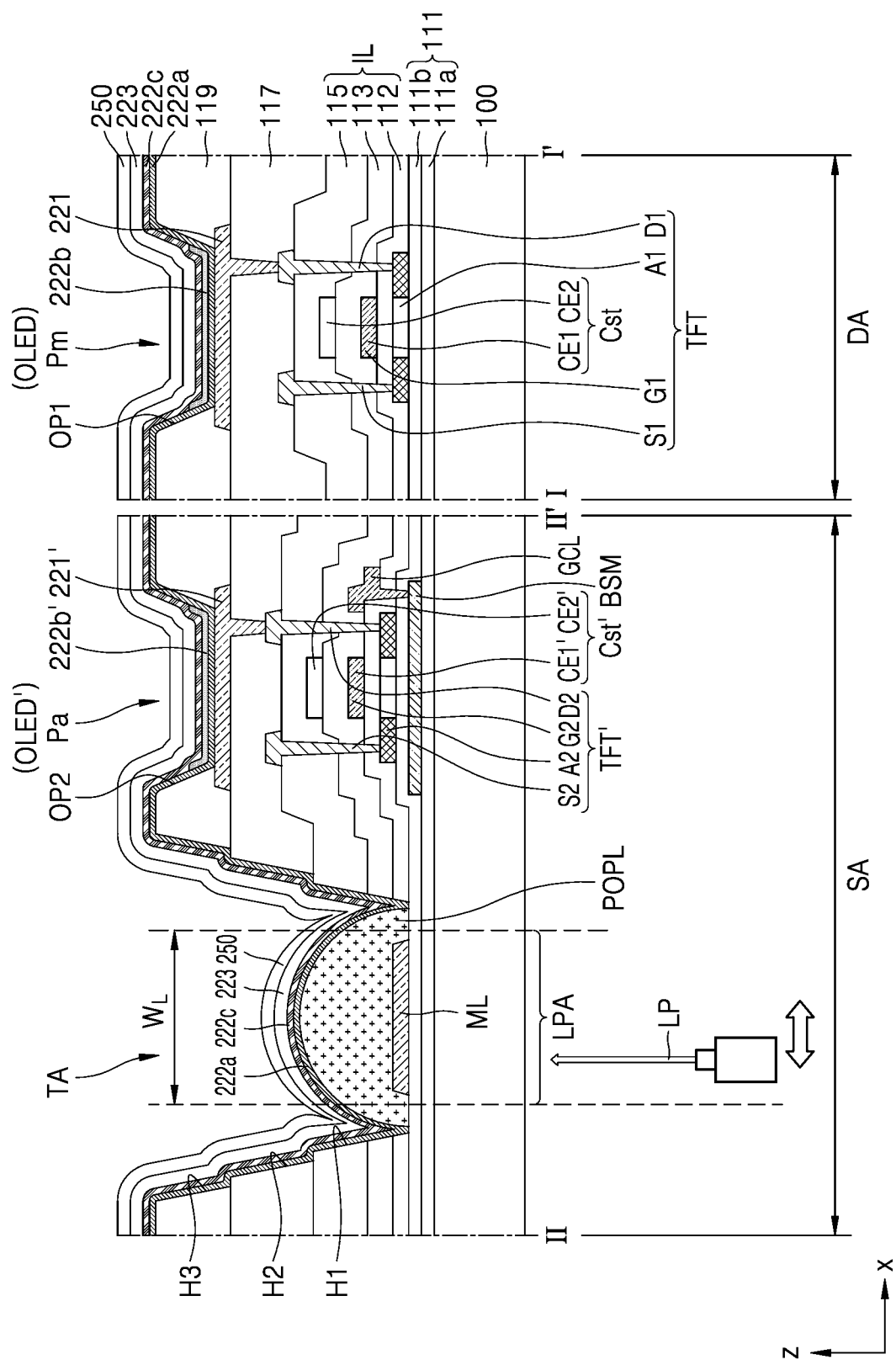
Figure 8C:
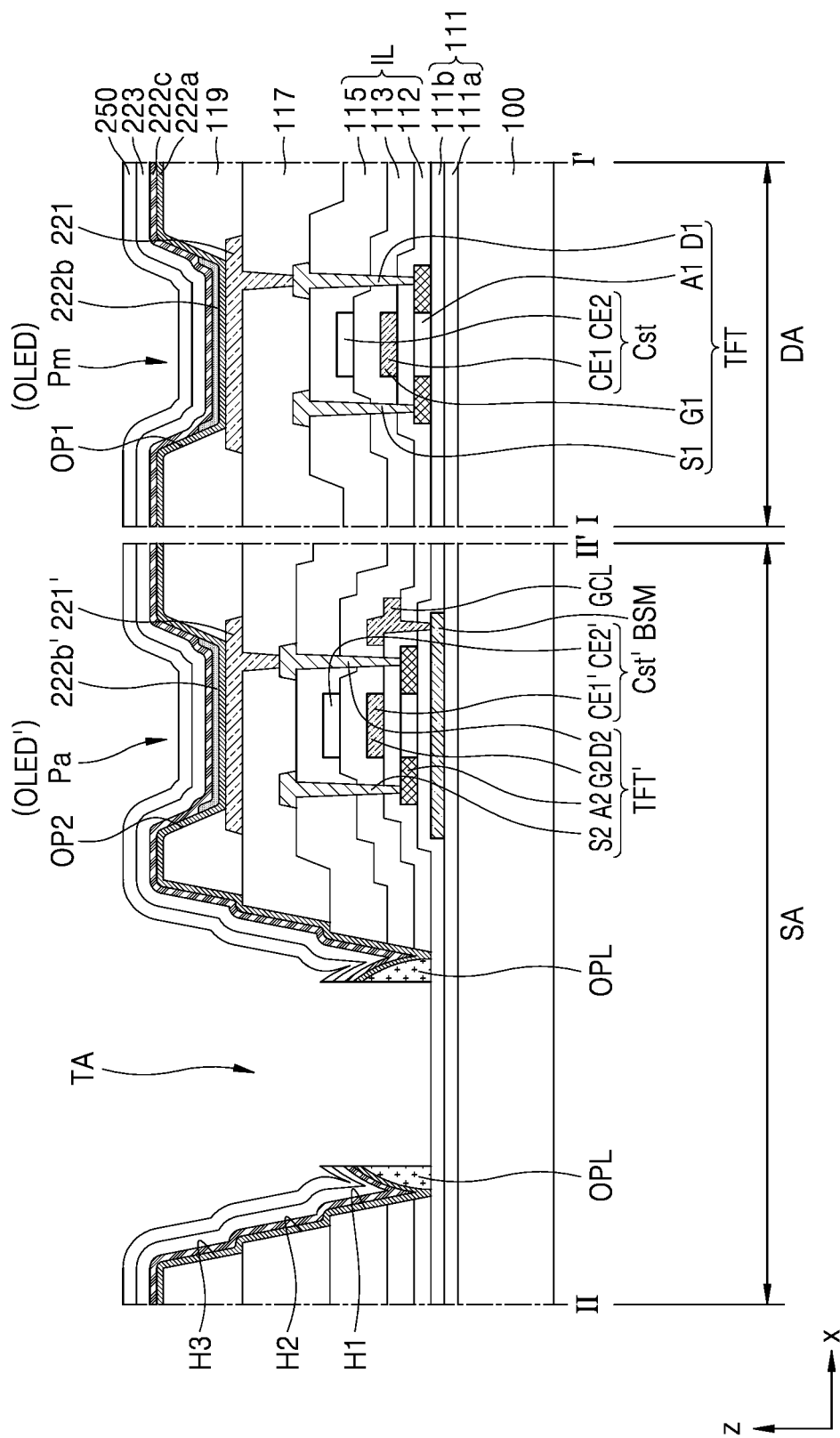

FIGS. 8A to 8C are cross-sectional view sequentially illustrating a method of manufacturing the display apparatus according to an embodiment.

Referring to FIG. 8A, a sacrificial metal layer ML is formed in the first hole H1 in the inorganic insulating layer IL. The sacrificial metal layer ML may include metal such as Ag, Al, Pt, Pd, Au, Ni, Mo, Ti, or the like. In addition, in other embodiments, the sacrificial metal layer ML may further include a layer including ITO, IZO, ZnO or $In_2O_3$ on or below the metal described above. In an embodiment, the sacrificial metal layer ML may be formed of a same material as that of the first and second pixel electrodes 221 and 221' at the same time as the first and second pixel electrodes 221 and 221'.

Then, a preliminary organic pattern layer POPL is formed in the first hole H1 of the inorganic insulating layer IL to cover the sacrificial metal layer ML. The preliminary-organic pattern layer POPL may include various organic materials such as PI, polyamide, an acryl resin, BCB, HMDSO, a phenol resin, or the like. In some embodiments, the preliminary organic pattern layer POPL may include a photosensitive organic material.

In some embodiments, the preliminary organic pattern layer POPL may be formed of a same material as that of the pixel-defining layer 119 at the same time as the pixel-defining layer 119. However, the present disclosure is not limited thereto. The preliminary organic pattern layer POPL may be formed by using a process that is different from a process of forming the pixel-defining layer 119.

The preliminary organic pattern layer POPL may include an inclined surface forming an acute angle with respect to an upper surface of the substrate 100. In some embodiments, the preliminary organic pattern layer POPL may be formed to have a hemispherical shape. The hemispherical shape of the preliminary organic pattern layer POPL may be formed by using a half-tone mask. For example, after an organic material layer for forming the preliminary organic pattern layer POPL is applied to inside of the first hole H1, an amount of exposure transmitted to the organic material layer is changed according to positions in the organic material layer by using a halftone mask. Next, the preliminary organic pattern layer POPL having a hemispherical shape may be formed by performing developing and curing operations.

Then, on the preliminary organic pattern layer POPL, the first functional layer 222a, the second functional layer 222c, the opposite electrode 223, and the capping layer 250 may be sequentially formed integrally in the display area DA and the sensor area SA.

In this case, due to the shape of the preliminary organic pattern layer POPL, the first functional layer 222a, the second functional layer 222c, the opposite electrode 223, and/or the capping layer 250 may have small thicknesses at an edge of the preliminary organic pattern layer POPL. In some embodiments, the first functional layer 222a, the second functional layer 222c, the opposite electrode 223, and/or the capping layer 250 may be short-circuited at the edge of the preliminary organic pattern layer POPL.

Next, referring to FIG. 8B, a laser beam LP is emitted toward the sacrificial metal layer ML in the transmission area TA from a lower surface of the substrate 100. That is, the laser beam LP may proceed from the lower surface of the substrate 100 in a z-direction to be emitted toward a lower surface of the sacrificial metal layer ML. The laser beam LP may have a wavelength of infrared light. When the laser beam LP is infrared light, because transmittance thereof with respect to the substrate 100 and the buffer layer 111 is about 80 to 90% or higher, the laser beam LP may efficiently arrive at the sacrificial metal layer ML.

Because the sacrificial metal layer ML includes opaque metal, the sacrificial metal layer ML may absorb the laser beam LP. Accordingly, heat expansion in the sacrificial metal layer ML occurs, and a part of the sacrificial metal layer ML to which the laser beam LP is emitted may be lifted off from the substrate 100 or the buffer layer 111.

As the part of the sacrificial metal layer ML is lifted off, the preliminary organic pattern layer POPL, the first functional layer 222a, the second functional layer 222c, the opposite electrode 223, and the capping layer 250 may be removed together with the sacrificial metal layer ML, wherein the first functional layer 222a, the second functional layer 222c, the opposite electrode 223, and the capping layer 250 are arranged on the sacrificial metal layer ML which is lifted off. Accordingly, as shown in FIG. 8C, the organic pattern layer OPL arranged to surround a periphery of the transmission area TA is formed, and the transmission hole TAH including the first functional layer 222a, the second functional layer 222c, the opposite electrode 223, and the capping layer 250 may be formed.

When an inorganic material layer, an organic material layer, an opposite electrode, etc. in the transmission area TA are to be removed by emitting the laser beam LP from an upper portion of the substrate 100 in a-z-direction that is a direction of the transmission area TA to form the transmission hole TAH, a laser-processed surface may be secondarily damaged by a particle, wherein the particle may be generated in a process of removing the inorganic material layer, the organic material layer, the opposite electrode, etc. However, in the present embodiment, because lift-off caused by heat expansion in the sacrificial metal layer ML is used, a problem of damage due to particles may not occur.

In addition, because the first functional layer 222a, the second functional layer 222c, the opposite electrode 223, and the capping layer 250 have small thicknesses at an edge of the preliminary organic pattern layer POPL, the first functional layer 222a, the second functional layer 222c, the opposite electrode 223, and the capping layer 250 may be removed without unintentional secondary damage.

In the display apparatus according to embodiments, a pixel unit and a transmission area, of which light transmittance is enhanced, are arranged in a sensor area corresponding to a component such as a sensor, etc. Thus, an environment in which the component may operate may be provided, and at the same time, an image may be implemented in an area overlapping the component.

Accordingly, a display apparatus having various functions and enhanced quality at the same time may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
   a substrate comprising a display area and a sensor area, the display area comprising a main pixel, and the sensor area comprising an auxiliary pixel and a transmission area;
   a first pixel electrode and a light-emitting layer each in the main pixel;
   a second pixel electrode and a second light-emitting layer each in the auxiliary pixel;
   an opposite electrode integrally arranged in the display area and the sensor area, and defining an opening corresponding to the transmission area, and passing through the opposite electrode in a thickness direction; and
   an organic pattern layer surrounding at least a part of the transmission area.

2. The display apparatus of claim 1, further comprising an inorganic insulating layer on the substrate, and defining a first hole corresponding to the transmission area,
   wherein the opposite electrode is on a side wall of the first hole.

3. The display apparatus of claim 2, wherein the organic pattern layer is in the first hole.

4. The display apparatus of claim 2, wherein the opening of the opposite electrode is smaller than the first hole.

5. The display apparatus of claim 1, further comprising a functional layer integrally arranged in the display area and the sensor area between the first pixel electrode and the opposite electrode, and defining an opening corresponding to the transmission area,
   wherein the opening of the opposite electrode overlaps the opening of the functional layer to thereby form a transmission hole.

6. The display apparatus of claim 1, further comprising a pixel-defining layer covering edges of the first pixel electrode and the second pixel electrode, configured to define a light-emitting area, and comprising a same material as the organic pattern layer.

7. The display apparatus of claim 1, wherein a side of the organic pattern layer is thicker than the other side of the organic pattern layer.

8. The display apparatus of claim 1, wherein the opposite electrode is on the organic pattern layer, and a side thereof is thicker than the other side thereof.

9. The display apparatus of claim 1, further comprising a lower electrode layer in the sensor area, between the substrate and an auxiliary thin-film transistor of the auxiliary pixel.

10. The display apparatus of claim 1, further comprising a component on a lower surface of the substrate and corresponding to the sensor area.

11. A display apparatus comprising:
- a substrate on which a pixel comprising a display element and a transmission area are arranged;
- a pixel electrode and a light-emitting layer in the pixel;
- an opposite electrode on the light-emitting layer, and defining an opening corresponding to the transmission area; and
- an organic pattern layer at a periphery of the transmission area,
- wherein the opposite electrode is on the organic pattern layer and has an uneven thickness.

12. The display apparatus of claim 11, further comprising an inorganic insulating layer on the substrate, and defining a first hole corresponding to the transmission area,
- wherein the opposite electrode is on a side wall of the first hole.

13. The display apparatus of claim 12, wherein the organic pattern layer is in the first hole.

14. The display apparatus of claim 12, wherein an opening of the opposite electrode is smaller than the first hole.

* * * * *